United States Patent
Kwak

(10) Patent No.: US 10,943,664 B2
(45) Date of Patent: Mar. 9, 2021

(54) STORAGE DEVICE AND OPERATING METHOD THEREOF

(71) Applicant: SK hynix Inc., Gyeonggi-do (KR)

(72) Inventor: Woo Suk Kwak, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/726,712

(22) Filed: Dec. 24, 2019

(65) Prior Publication Data

US 2020/0357475 A1 Nov. 12, 2020

(30) Foreign Application Priority Data

May 10, 2019 (KR) .......................... 10-2019-0055265

(51) Int. Cl.
| | |
|---|---|
| *G11C 16/26* | (2006.01) |
| *G11C 16/04* | (2006.01) |
| *G11C 16/08* | (2006.01) |
| *G06F 3/06* | (2006.01) |
| *G11C 11/56* | (2006.01) |

(52) U.S. Cl.
CPC ............ *G11C 16/26* (2013.01); *G06F 3/0619* (2013.01); *G06F 3/0659* (2013.01); *G06F 3/0679* (2013.01); *G11C 16/0483* (2013.01); *G11C 16/08* (2013.01); *G11C 11/5642* (2013.01); *G11C 11/5671* (2013.01)

(58) Field of Classification Search
CPC ..... G11C 16/26; G11C 16/0483; G11C 16/08; G11C 11/5642; G11C 11/5671; G06F 3/0619; G06F 3/0659; G06F 3/0679
See application file for complete search history.

(56) References Cited

U.S. PATENT DOCUMENTS

| | | | | |
|---|---|---|---|---|
| 8,159,881 B2* | 4/2012 | Yang | ...................... | G11C 16/30 365/185.18 |
| 2009/0300465 A1* | 12/2009 | Wu | ...................... | G11C 11/5642 714/763 |
| 2016/0372161 A1* | 12/2016 | Chae | ................... | G06F 11/1004 |

FOREIGN PATENT DOCUMENTS

KR 10-2017-0058066 5/2017

* cited by examiner

*Primary Examiner* — Vanthu T Nguyen
(74) *Attorney, Agent, or Firm* — IP&T Group LLP

(57) ABSTRACT

A storage device configured to provide an improved data recovery rate includes a memory device including a plurality of memory cells and a memory controller. The memory controller includes a read operation controller for controlling the memory device to perform a read operation by applying a default read voltage or optimal read voltage to a selected word line coupled to selected memory cells among the plurality of memory cells; and an optimal read voltage operating component for determining the optimal read voltage when the read operation using the default read voltage fails, based on an average threshold voltage and cell number information which are information on a memory cell number for each of first and second distributions which are adjacent threshold voltage distributions among threshold voltage distributions that the threshold voltages of the selected memory cells form.

14 Claims, 12 Drawing Sheets

FIG. 10

| REFERENCE VOLTAGE | REFERENCE DATA | NUMBER OF 1S |
|---|---|---|
| Vref1 | D1 | 2145 |
| Vref2 | D2 | 2135 |
| Vref3 | D3 | 2123 |
| ... | ... | |
| VrefK | DK | 1178 |
| VrefK+1 | DK+1 | 1145 |
| ... | ... | |
| VrefN-2 | DN-2 | 123 |
| VrefN-1 | DN-1 | 115 |
| VrefN | DN | 110 |

| INTERVAL | REFERENCE VOLTAGE | NUMBER OF MEMORY CELLS |
|---|---|---|
| INTERVAL L1 | Vref1 – Vref2 | 10 |
| INTERVAL L2 | Vref2 – Vref3 | 12 |
| ... | ... | |
| INTERVAL LK | VrefK – VrefK+1 | 33 |
| ... | ... | |
| INTERVAL LN-2 | VrefN-2 – VrefN-1 | 8 |
| INTERVAL LN-1 | VrefN-1 – VrefN | 5 |

FIG. 11

| REFERENCE VOLTAGE | REFERENCE DATA | NUMBER OF 1S |
|---|---|---|
| $V_{href1}$ | $D_{h1}$ | 2153 |
| $V_{href2}$ | $D_{h2}$ | 2157 |
| $V_{href3}$ | $D_{h3}$ | 2160 |
| $V_{href4}$ | $D_{h4}$ | 2165 |
| ... | ... | |
| $V_{hrefK}$ | $D_{hK}$ | 2333 |
| $V_{hrefK+1}$ | $D_{hK+1}$ | 2352 |
| ... | ... | |
| $V_{hrefM-2}$ | $D_{hM-2}$ | 2465 |
| $V_{hrefM-1}$ | $D_{hM-1}$ | 2471 |
| $V_{hrefM}$ | $D_{hM}$ | 2473 |

| INTERVAL | REFERENCE VOLTAGE | NUMBER OF MEMORY CELLS |
|---|---|---|
| INTERVAL h1 | $V_{href1} - V_{href2}$ | 4 |
| INTERVAL h2 | $V_{href2} - V_{href3}$ | 3 |
| INTERVAL h3 | $V_{href3} - V_{href3+1}$ | 5 |
| ... | ... | |
| INTERVAL hK | $V_{hrefK} - V_{hrefK+1}$ | 19 |
| ... | ... | |
| INTERVAL hM-2 | $V_{hrefM-2} - V_{hrefM-1}$ | 6 |
| INTERVAL hM-1 | $V_{hrefM-1} - V_{hrefM}$ | 2 |

STORAGE DEVICE AND OPERATING METHOD THEREOF

CROSS-REFERENCE TO RELATED APPLICATION

The present application claims priority under 35 U.S.C. § 119(a) to Korean patent application number 10-2019-0055265, filed on May 10, 2019, which is incorporated herein by reference in its entirety.

BACKGROUND

Field of Invention

The present disclosure generally relates to an electronic device, and more particularly, to a storage device configured to recover data and an operating method thereof.

Description of Related Art

A storage device is a device the stores data under the control of a host device such as a computer or a smart phone. The storage device may include a memory device for storing data and a memory controller for controlling the memory device. The memory device is classified into a volatile memory device and a nonvolatile memory device.

The volatile memory device is a memory device in which data is stored only when power is supplied, and stored data disappears when the supply of power is interrupted. The volatile memory device may include a Static Random Access Memory (SRAM), a Dynamic Random Access Memory (DRAM), and the like.

The nonvolatile memory device is a memory device in which data does not disappear even when the supply of power is interrupted. The nonvolatile memory device may include a Read Only Memory (ROM), a Programmable ROM (PROM), an Electrically Programmable ROM (EPROM), an Electrically Erasable ROM (EEROM), a flash memory, and the like.

SUMMARY

Embodiments provide a storage device configured to provide an improved data recovery rate and an operating method thereof.

In accordance with an aspect of the present disclosure, there is provided a memory controller for controlling a memory device including a plurality of memory cells, the memory controller including: a read operation controller configured to the memory device to perform a read operation by applying a default read voltage or optimal read voltage to a selected word line coupled to selected memory cells among the plurality of memory cells; and an optimal read voltage operating component configured to determine the optimal read voltage when the read operation using the default read voltage fails, based on an average threshold voltage and cell number information which are information on a memory cell number for each of first and second distributions which are adjacent threshold voltage distributions among threshold voltage distributions that the threshold voltages of the selected memory cells form.

In accordance with another aspect of the present disclosure, there is provided a method for operating a memory controller for controlling a memory device, the method including: acquiring reference data chunks by reading selected memory cells included in the memory device, using a plurality of reference voltages; calculating numbers of memory cells belonging to a plurality of reference voltage intervals that the plurality of reference voltages form, based on numbers of on-cells identified by the reference data chunks; calculating an average threshold voltage for each of adjacent threshold voltage distributions that the selected memory cells form and cell number information which is information on memory cell numbers included in the threshold voltage distributions, based on the numbers of memory cells included in the plurality of reference voltage intervals; and acquiring an optimal read voltage, based on the average threshold voltage and the cell number information.

In accordance with still another aspect of the present disclosure, there is provided a memory device including: a memory cell array including a plurality of memory cells; a peripheral circuit configured to perform a read operation of reading data stored in selected memory cells among the plurality of memory cells; and a control logic configured to control the peripheral circuit to apply an optimal read voltage to a selected word line coupled to the selected memory cells in the read operation, wherein the optimal read voltage is calculated based on average threshold voltages and cell number information of adjacent threshold voltage distributions among threshold voltage distributions corresponding to the selected memory cells.

In accordance with another aspect of the present disclosure, there is provided a method for operating a memory controller for controlling a memory device, the method including: controlling the memory device to read plural pieces of reference data from memory cells respectively with plural reference voltages forming reference voltage ranges for a threshold voltage distribution representing each of cell statuses; and controlling the memory device to read data from the memory cells with an optimal read voltage defined as follows:

$$V_{optimal\,read} = V_{mean1} + \frac{V_{mean2} - V_{mean1}}{2} + \frac{\sigma^2}{V_{mean2} - V_{mean1}}\left(\frac{n_1}{n_2}\right),$$

wherein $V_{optimal}$ read is the optimal read voltage; $V_{mean1}$ and $V_{mean2}$ are respectively threshold voltages of lower and higher threshold voltages between adjacent threshold voltage distributions; $\sigma^2$ is a variance of a Gaussian distribution; and $n_1$ and $n_2$ are respectively numbers of cells corresponding to the lower and higher threshold voltage distributions, wherein the number of cells is a greatest one among numbers of cells, the numbers being respectively belonging to the reference voltage ranges and identified from the reference data, and wherein the threshold voltage is any one within one among the reference voltage ranges corresponding to the number of cells.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 9 to 11 are diagrams illustrating a method for finding an average threshold voltage and cell number information.

DETAILED DESCRIPTION

Figure 1:
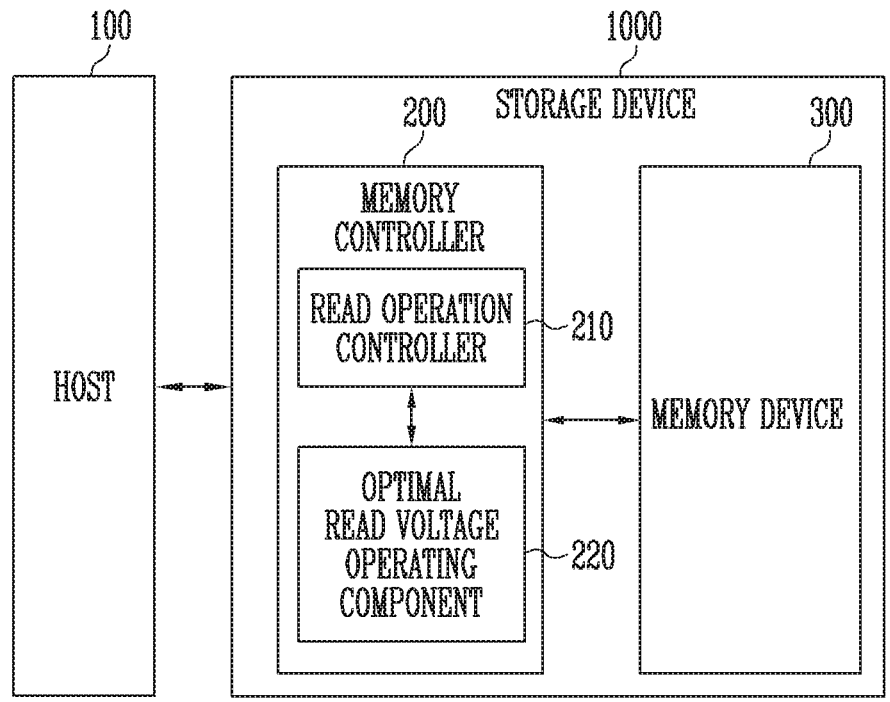
FIG. 1 is a block diagram illustrating a configuration of a storage device in accordance with an embodiment of the present disclosure.

The specific structural or functional description disclosed herein is merely illustrative for the purpose of describing embodiments according to the concept of the present disclosure. The embodiments of the present disclosure can also be implemented in various other forms, and is not to be construed as limited to the embodiments set forth herein.

The embodiments of the present disclosure can be variously modified and have various shapes. Thus, the embodiments are illustrated in the drawings and are intended to be described herein in detail. However, the embodiments of the present disclosure are not construed as limited to specified disclosures, and may include all changes, equivalents, or substitutes that do not depart from the spirit and technical scope of the present disclosure.

While terms such as "first" and "second" may be used to describe various components, such components must not be understood as being limited to the above terms. The above terms are used only to distinguish one component from another. For example, a first component may be referred to as a second component without departing from the scope of the present disclosure, and likewise a second component may be referred to as a first component.

It will be understood that when an element is referred to as being "connected" or "coupled" to another element, it can be directly connected or coupled to the other element or intervening elements may also be present. In contrast, when an element is referred to as being "directly connected" or "directly coupled" to another element, no intervening elements are present. Meanwhile, other expressions describing relationships between components such as "~ between," "immediately ~, between" or "adjacent to ~" and "directly adjacent to ~" may be construed similarly.

The terms used in the present application are merely used to describe particular embodiments, and are not intended to limit the present disclosure. Singular forms in the present disclosure are intended to include the plural forms as well, unless the context clearly indicates otherwise. The articles 'a' and 'an' as used in this application and the appended claims should generally be construed to mean 'one or more' unless specified otherwise or clear from context to be directed to a singular form. It will be further understood that terms such as "including" or "having," etc., are intended to indicate the existence of the features, numbers, operations, actions, components, parts, or combinations thereof disclosed in the specification, and are not intended to preclude the possibility that one or more other features, numbers, operations, actions, components, parts, or combinations thereof may exist or may be added.

So far as not being differently defined, all terms used herein including technical or scientific terminologies have meanings that they are commonly understood by those skilled in the art to which the present disclosure pertains. The terms having the definitions as defined in the dictionary should be understood such that they have meanings consistent with the context of the related technique. So far as not being clearly defined in this application, terms should not be understood in an ideally or excessively formal way.

In describing those embodiments, description will be omitted for techniques that are well known to the art to which the present disclosure pertains, and are not directly related to the present disclosure. This intends to disclose the gist of the present disclosure more clearly by omitting unnecessary description.

It is noted that reference to "an embodiment," "another embodiment" or the like does not necessarily mean only one embodiment, and different references to any such phrase are not necessarily to the same embodiment(s).

Hereinafter, various embodiments of the present disclosure will be described in detail with reference to the accompanying drawings in order for those skilled in the art to be able to readily implement the technical spirit of the present disclosure.

FIG. 1 is a block diagram illustrating a configuration of a storage device in accordance with an embodiment of the present disclosure.

Referring to FIG. 1, the storage device 1000 may include a memory controller 200 and a memory device 300.

The storage device 1000 may be a device for storing data under the control of a host 100, such as a mobile phone, a smart phone, an MP3 player, a laptop computer, a desktop computer, a game console, a TV, a tablet PC or an in-vehicle infotainment.

The storage device 1000 may be manufactured as any one of various types of storage devices according to a host interface that is a communication scheme with the host 100. For example, the storage device 1000 may be implemented with any one of a variety of types of storage devices, such as a Solid State Drive (SSD), a Multi-Media Card (MMC), an Embedded MMC (eMMC), a Reduced Size MMC (RS- MMC), a micro-MMC (micro-MMC), a Secure Digital (SD) card, a mini-SD card, a micro-SD card, a Universal Serial Bus (USB) storage device, a Universal Flash Storage (UFS) device, a Compact Flash (CF) card, a Smart Media Card (SMC), a memory stick, and the like.

The storage device 1000 may be manufactured as any one of various package types. For example, the storage device 1000 may be manufactured as any one of various package types such as a Package-On-Package (POP), a System-In-Package (SIP), a System-On-Chip (SOC), a Multi-Chip Package (MCP), a Chip-On-Board (COB), a Wafer-level Fabricated Package (WFP), and a Wafer-level Stack Package (WSP).

The memory controller 200 may control overall operations of the storage device 1000. When power is applied to the storage device 1000, the memory controller 200 may execute firmware (FW). When the memory device 300 is a flash memory device, the memory controller 200 may execute FW such as a Flash Translation Layer (FTL) for controlling communication between the host 100 and the memory device 300.

When a write request is input from the host 100, the memory controller 200 may receive data to be stored and a Logical Address (LA) for identifying the corresponding data from the host 100. The memory controller 200 may convert the input logical address into a Physical Address (PA) representing a physical address corresponding to memory cells in which data is to be stored among memory cells included in the memory device 300. The memory controller 200 may provide the memory device 300 with a program command for storing data, the converted physical address, and data to be stored.

In an embodiment, when a read request is input from the host 100, the memory controller 200 may receive a logical address for identifying data to be read from the host 100. The memory controller 200 may acquire a physical address corresponding to the input logical address, and provide a read command and the physical address to the memory device 300. In various embodiments, in an erase operation, the memory controller 200 may provide an erase command and a physical address to the memory device 300.

In an embodiment, the memory controller 200 may control the memory device 300 to autonomously perform a program operation, a read operation, or an erase operation regardless of a request from the host 100. For example, the memory controller 200 may control the memory device 300 to perform background operations such as wear leveling, garbage collection, and read reclaim.

The memory device 300 may store data. The memory device 300 operates under the control of the memory controller 200. The memory device 300 may include a memory cell array including a plurality of memory cells for storing data. The memory cell array may include a plurality of memory blocks. The memory block may include a plurality of memory cells. The memory block may be a unit for erasing data stored in the memory device 300. In an embodiment, the memory block may include a plurality of pages. The page may be a unit for storing data in the memory device 300 or reading data stored in the memory device 300.

In an embodiment, the memory device 300 may be a Double Data Rate Synchronous Dynamic Random Access Memory (DDR SDRAM), a Low Power Double Data Rate 4 (LPDDR4) SDRAM, a Graphics Double Data Rate (GDDR) SRAM, a Low Power DDR (LPDDR), a Rambus Dynamic Random Access Memory (RDRAM), a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (SU-RAM), or the like. In this specification, for convenience of description, a case where the memory device 300 is a NAND flash memory is described.

In an embodiment, the memory device 300 may be implemented in a three-dimensional array structure. The present disclosure may be applied to not only a flash memory device in which a charge storage layer is configured with a Floating Gate (FG) but also a Charge Trap Flash (CTF) in which a charge storage layer is configured with an insulating layer.

In an embodiment, each of the memory cells included in the memory device 300 may operate as any one of a Single Level Cell (SLC) for storing one data bit, a Multi-Level Cell (MLC) for storing two data bits, a Triple Level Cell (TLC) for storing three data bits, and a Quad Level Cell (QLC) for storing four data bits.

In an embodiment of the present disclosure, the memory controller 200 may further include a read operation controller 210 and an optimal read voltage operating component 220.

When a read request for a specific logical address is input from the host 1000, the memory controller 200 may acquire a physical address corresponding to the logical address read-requested by the host 100, and provide the memory device 300 with a read command for requesting data stored at the physical address.

The memory device 300 may perform a read operation in response to the read command. The read operation may be an operation of sensing data stored in memory cells corresponding to the physical address provided by the memory controller 200, using a predetermined read voltage. The read operation controller 210 may acquire read data as a result obtained when the memory device 300 performs the read operation, and perform error correction decoding on the acquired read data.

The error correction decoding may pass or fail depending on a number of error bits included in the read data. For example, when the number of error bits included in the read data is equal to or smaller than that of correctable error bits, the error correction decoding may pass. On the contrary, when the number of error bits included in the read data exceeds that of correctable error bits, the error correction decoding may fail. When the error correction decoding passes, the read operation controller 210 may acquire original data corresponding to the logical address requested by the host 100. When the error correction decoding passes, the read operation performed by the memory device 300 may pass. When the error correction decoding fails, the read operation controller 210 cannot acquire the original data. When the error correction decoding fails, the read operation performed by the memory device 300 may fail.

In an embodiment, the read operation controller 210 may further include an error corrector (not shown) for determining whether the read operation has passed or failed.

Threshold voltages of the memory cells included in the memory device 300 may be changed by various causes. Therefore, a read operation may fail using a default read voltage stored in advance in the memory device 300.

When the read operation performed using the default read voltage fails, the read operation controller 210 may provide the memory device 300 with read commands instructing the memory device 300 to perform a plurality of read operations to determine an optimal read voltage as a read voltage for recovering data stored at a read-requested physical address. Specifically, the read operation controller 210 may provide the memory device 300 with read commands requesting read operations using a plurality of reference voltages, which are predetermined, so as to acquire reference data required to determine the optimal read voltage. The read operation controller 210 may acquire, from the memory device 300, reference data as a result of the read operations performed using the plurality of reference voltages.

The read operation controller 210 may provide the reference data to the optimal read voltage operating component 220.

The optimal read voltage operating component 220 may calculate an optimal read voltage by using the reference data. The optimal read voltage operating component 220 may provide the calculated optimal read voltage to the read operation controller 210. The read operation controller 210 may provide the memory device 300 with a read command instructing the memory device 300 to read the data stored at the physical address by using the optimal read voltage.

Since the optimal read voltage is a read voltage obtained by reflecting a change in threshold voltage of a memory cell, a read operation using the optimal read voltage may pass. The memory controller 200 may recover original data and provide the original data to the host 100.

The host 100 may communicate with the storage device 1000, using at least one of various communication manners, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a Non-Volatile Memory express (NVMe), a universal flash storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

Figure 2:
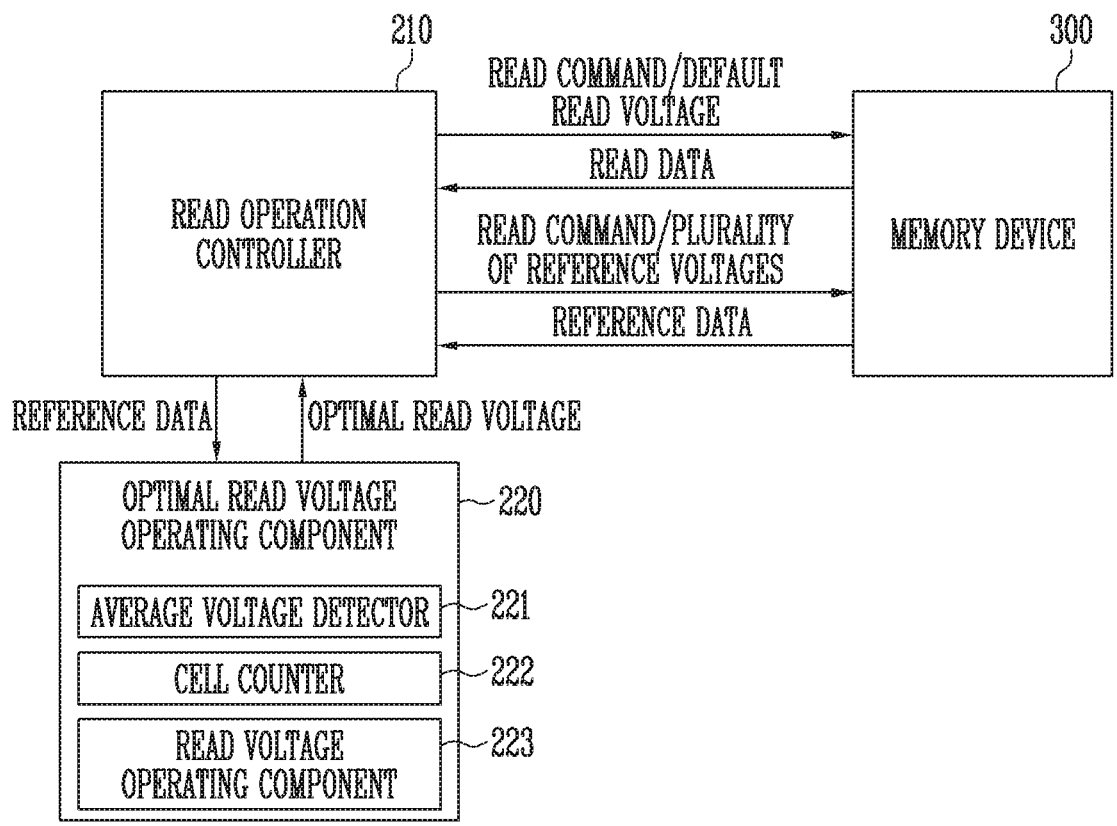
FIG. 2 is a block diagram illustrating a structure of a memory controller shown in FIG. 1.

FIG. 2 is a block diagram illustrating a structure of the memory controller shown in FIG. 1.

Referring to FIG. 2, the memory controller 200 may include a read operation controller 210 and an optimal read voltage operating component 220. The optimal read voltage operating component 220 includes all circuits, systems, software, firmware and devices necessary for its operations and functions.

The number of threshold voltage distributions in which the memory cells of the memory device are included may vary depending on the number of data bits that each memory cell stores. For example, when one memory cell stores data of one bit, the memory cell may have a threshold voltage that belongs to a threshold voltage distribution corresponding to any one of an erase state and a program state. Alternatively, when one memory cell stores data of two bits, the memory cell may have a threshold voltage that belongs to a threshold voltage distribution corresponding to any one of four states. Therefore, the number of read voltages for reading data stored in a memory cell may be increased as the number of data bits that the memory cell stores is increased.

Hereinafter, a case where an optimal read voltage for distinguishing threshold voltage distributions corresponding to two adjacent states is described. However, the embodiment of the present disclosure is not limited to a case where the number of threshold voltage distributions is two, and the same method may be applied to a case where an optimal read voltage between four or more threshold voltage distributions is calculated.

The read operation controller 210 may provide a read command to the memory device 300. In an embodiment, the read operation controller 210 may provide a physical address to be read together with the read command. In various embodiments, the read operation controller 210 may provide a command instructing the memory device 300 to change a read voltage before the read operation controller provides the read command to the memory device 300.

When the read operation controller 210 provides the read command to the memory device 300, the memory device 300 may read data stored in memory cells corresponding to the physical address read-requested using a default read voltage. The default read voltage may be a read voltage stored in advance in the memory device 300. The default read voltage may be calculated through various tests when the memory device 300 is manufactured, and be stored in the memory device 300.

The read operation controller 210 may acquire, from the memory device 300, read data as a result obtained by performing a read operation, using the default read voltage.

When error correction decoding of the read data fails, the read operation controller 210 may provide the read commands to the memory device 300 to read the data stored in the memory cells by using a plurality of reference voltages so as to acquire reference data required to calculate an optimal read voltage.

The memory device may perform read operations using a plurality of reference voltages. Specifically, the memory device 300 may acquire reference data (e.g., reference data chunks $D_{f1}$ to $D_{fN}$ and $D_{h1}$ to $D_{hM}$ shown in FIGS. 10 and 11) by sequentially applying a plurality of reference voltages (e.g., reference voltages $V_{lref1}$ to $V_{lrefN}$ and $V_{href1}$ to $V_{hrefM}$ shown in FIGS. 9 to 11) to a word line coupled to selected memory cells. The read operation controller 210 may acquire the reference data from the memory device 300. The read operation controller 210 may transfer the acquired reference data to the optimal read voltage operating component 220.

The optimal read voltage operating component 220 may calculate an optimal read voltage ($V_{optimal\ read}$ that will be described later), based on the reference data. The optimal read voltage operating component 220 may transfer the calculated optimal read voltage to the read operation controller 210.

The optimal read voltage operating component 220 may include an average voltage detector 221, a cell counter 222, and a read voltage operating component 223. The read voltage operating component 223 includes all circuits, systems, software, firmware and devices necessary for its operations and functions.

The average voltage detector 221 may acquire an average threshold voltage of each of threshold voltage distributions formed by the read-requested memory cells by using the reference data.

The cell counter 222 may acquire cell number information which is information on a number of memory cells included in each of threshold voltage distributions formed by memory cells selected using the reference data.

The read voltage operating component 223 may acquire an optimal read voltage by using the average threshold voltage and the cell number information.

Figure 3:
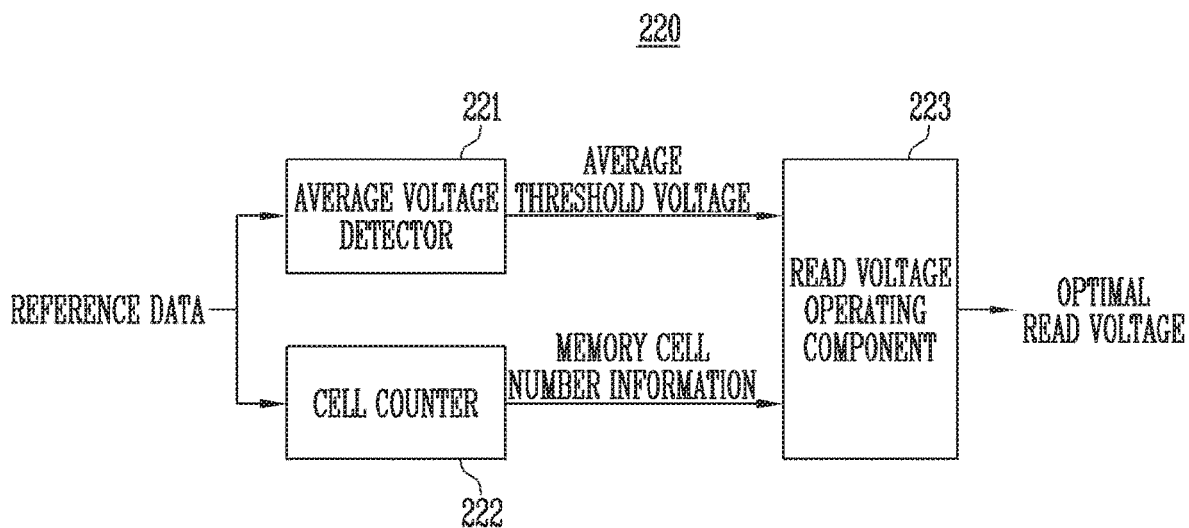
FIG. 3 is a block diagram illustrating a configuration of an optimal read voltage operating component shown in FIG. 2.

FIG. 3 is a block diagram illustrating a configuration of the optimal read voltage operating component shown in FIG. 2.

Referring to FIG. 3, the optimal read voltage operating component 220 may include an average voltage detector 221, a cell counter 222, and a read voltage operating component 223.

The read operation controller 210 may provide a read command to the memory device 300 to perform a read operation on the memory cells corresponding to the physical address read-requested using the optimal read voltage.

The average voltage detector 221 may receive reference data from the read operation controller 210. The reference data received by the average voltage detector 221 may be reference data chunks (e.g., reference data chunks $D_{l1}$ to $D_{lN}$ and $D_{h1}$ to $D_{hM}$ shown in FIGS. 10 and 11) respectively corresponding to a plurality of reference voltages (e.g., reference voltages Wei to $V_{lrefN}$ and $V_{href1}$ to $V_{hrefM}$ shown in FIGS. 9 to 11).

The average voltage detector 221 may calculate an average threshold voltage (e.g., $V_{mean1}$ or $V_{mean2}$) of each of two adjacent threshold voltage distributions (e.g., threshold voltage distributions P1 and P2 respectively corresponding to the average threshold voltages $V_{mean1}$ and $V_{mean2}$) by using the reference data.

Specifically, the average voltage detector 221 may count a number of on-cells or off-cells identified by each of the reference data chunks. For example, the average voltage detector 221 may calculate numbers of memory cells respectively included in a plurality of reference voltage intervals that the plurality of reference voltages form by using numbers of on-cells identified by the respective reference data chunks. The average voltage detector 221 may calculate numbers of memory cells included in the plurality of reference voltage intervals and determine, as a selected reference voltage interval, a reference voltage interval in which the largest number of memory cells is included.

The average voltage detector 221 may determine, as an average threshold voltage, any one voltage within the selected reference voltage interval. In an embodiment, the average voltage detector 221 may determine, as the average threshold voltage, a median value of the selected reference voltage interval. A method in which the average voltage detector 221 detects an average threshold voltage by using reference data will be described in more detail with reference to FIGS. 9 to 11.

The cell counter 222 may receive the reference data (e.g., reference data chunks $D_{l1}$ to $D_{lN}$ and $D_{h1}$ to $D_{hM}$ shown in FIGS. 10 and 11) from the read operation controller 210. The cell counter 222 may acquire cell number information (e.g., $n_1$ and $n_2$ respectively for the threshold voltage distributions P1 and P2) as information on numbers of memory cells included in threshold voltage distributions by using the reference data.

Specifically, the cell counter 222 may count a number of on-cells or off-cells identified by each of the reference data chunks. For example, the cell counter 222 may calculate numbers of memory cells respectively included in the plurality of reference voltage intervals that the plurality of reference voltages form by using numbers of on-cells identified by the respective reference data chunks.

The cell counter 222 may determine the greatest value among the numbers of memory cells included in the plurality of reference voltage intervals as the cell number information (e.g., $n_1$ and $n_2$). A method in which the cell counter 222 acquires the cell number information by using reference data will be described in detail with reference to FIGS. 9 to 11.

The read voltage operating component 223 may calculate an optimal read voltage ($V_{optimal}$ read that will be described later), based on the average threshold voltage (e.g., $V_{mean1}$ or $V_{mean2}$) received from the average voltage detector 221 and the cell number information (e.g., $n_1$ and $n_2$) received from the cell counter 222.

In an embodiment, when an average threshold voltage of each distribution is not changed, but only cell number information for each distribution is changed, an optimal read voltage may be calculated without calculating the average threshold voltage. In an embodiment of the present disclosure, the optimal read voltage operating component 220 may calculate an optimal read voltage, based on an average threshold voltage for each threshold voltage distribution which is determined in advance, and the cell number information received from the cell counter 222.

In an embodiment, when cell number information for each distribution is not changed, but only an average threshold voltage of each distribution is changed, an optimal read voltage may be calculated without calculating the cell number information. In an embodiment of the present disclosure, the optimal read voltage operating component 220 may calculate an optimal read voltage, based on cell number information for each threshold voltage distribution, which is determined in advance, and the average threshold voltage received from the average voltage detector 221.

Figure 4:
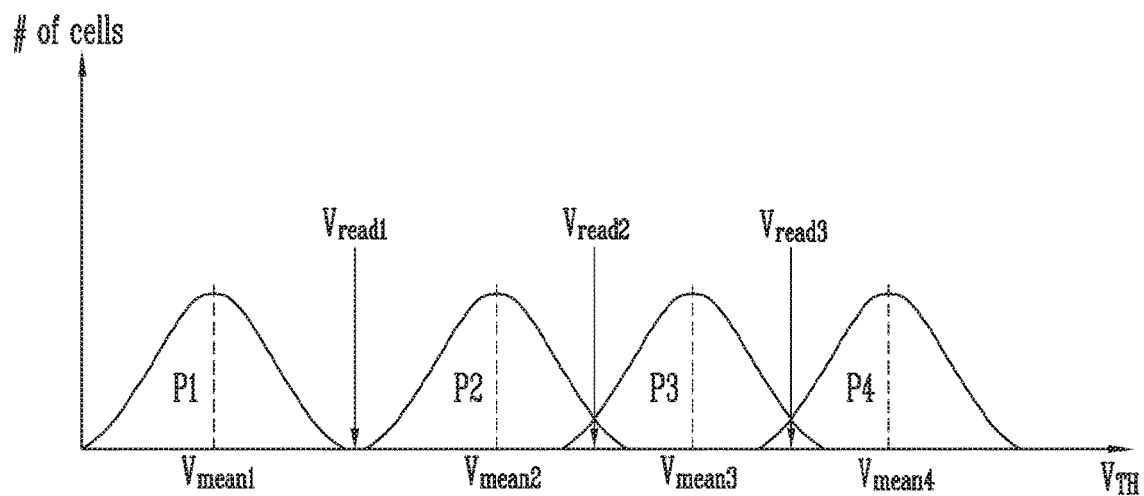
FIG. 4 is a diagram illustrating an average threshold voltage and a read voltage.

FIG. 4 is a diagram illustrating an average threshold voltage and a read voltage.

The memory cells included in the memory device may have different characteristics. Therefore, although the same program voltage is applied to selected memory cells, threshold voltages of the selected memory cells may form a distribution.

FIG. 4 illustrates a threshold voltage distribution of memory cells, when each of the memory cells is a Multi-Level Cell (MLC) for storing data of two bits.

Each of the memory cells may have a threshold voltage belonging to any one of four distributions P1, P2, P3, and P4 according to data stored therein. The distribution P1 may be a threshold voltage distribution of memory cells having stored data that is in a first state. The distribution P2 may be a threshold voltage distribution of memory cells having stored data that is in a second state. The distribution P3 may be a threshold voltage distribution of memory cells having stored data that is in a third state. The distribution P4 may be a threshold voltage distribution of memory cells having stored data that is in a fourth state.

The average threshold voltage may be a voltage corresponding to a point at which the number of memory cell is greatest in each threshold voltage distribution. For example, the number of memory cells having a threshold voltage of $V_{mean}$ is greatest in the threshold voltage distribution corresponding to the first state, and therefore, $V_{mean1}$ may be an average threshold voltage of P1. Similarly, average threshold voltages corresponding to the distributions P2, P3, and P4 may be Vmean2, Vmean3, and Vmean4, respectively.

The read voltage may be a voltage applied to a selected word line to check in which distribution a threshold voltage of a selected memory cell is included. For example, when $V_{read1}$ is applied to a word line of a memory cell corresponding to the distribution P1, the memory cell is read as an on-cell. However, when $V_{read1}$ is applied to a word line of a memory cell having a threshold voltage included in the distribution P2, the memory cell is read as an off-cell. Therefore, $V_{read1}$ may be a read voltage for distinguishing the distributions P1 and P2 from each other. In this manner, $V_{read2}$ may be a read voltage for distinguishing the second and third states from each other, and $V_{read3}$ may be a read voltage for distinguishing the third and fourth states from each other.

Figure 5:
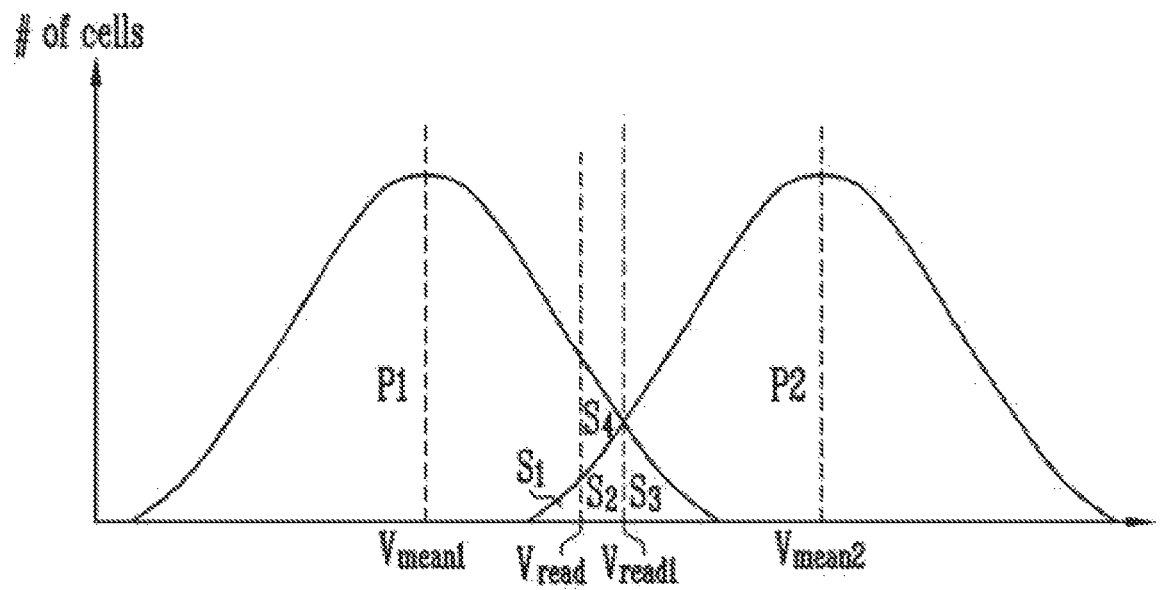
FIG. 5 is a diagram illustrating a read voltage for minimizing a read operation failure when numbers of memory cells forming threshold voltage distributions are the same.

FIG. 5 is a diagram illustrating a read voltage for minimizing a read operation failure when numbers of memory cells forming threshold voltage distributions are the same.

As shown in FIG. 5, when a read operation is performed using a default read voltage $V_{read}$, a probability $P_{rf}$ that the read operation will fail may be acquired by the following Equation 1.

$P_{rf}$=Number of cells located in areas $S1$ to $S4$/(Number of cells forming distribution $P1$+Number of cells forming distribution $P2$)     [Equation 1]

A read voltage determined to reduce the probability that read operation will fail may be a voltage corresponding to a point at which both distributions intersect each other. When each distribution is a Gaussian distribution, a voltage corresponding to a point at which both adjacent distributions intersect each other may be a median value of an average threshold value of both the distributions, when numbers of memory cells forming both the distributions are the same. For example, when numbers of memory cells forming the distributions P1 and P2 are the same, an median read voltage $V_{read1}$ as a median value of $V_{mean1}$ and $V_{mean2}$ may be a read voltage for minimizing that the read operation fails.

In FIG. 5, when a read operation is performed using the median read voltage $V_{read1}$, a probability $P_{rf1}$ that the read operation will fail may be acquired by the following Equation 2.

$P_{rf1}$=Number of cells located in areas $S1$ to $S3$/ (Number of cells forming distribution $P1$+Number of cells forming distribution $P2$)     [Equation 2]

As compared with the probability $P_{rf}$ that the read operation will fail when the read operation is performed using the default read voltage $V_{read}$, a memory cell located in the area S4 is not regarded as a memory cell having no error bit, when the read operation is performed using the median read voltage $V_{read1}$. Thus, the probability that the read operation will fail can be reduced.

Figure 6:
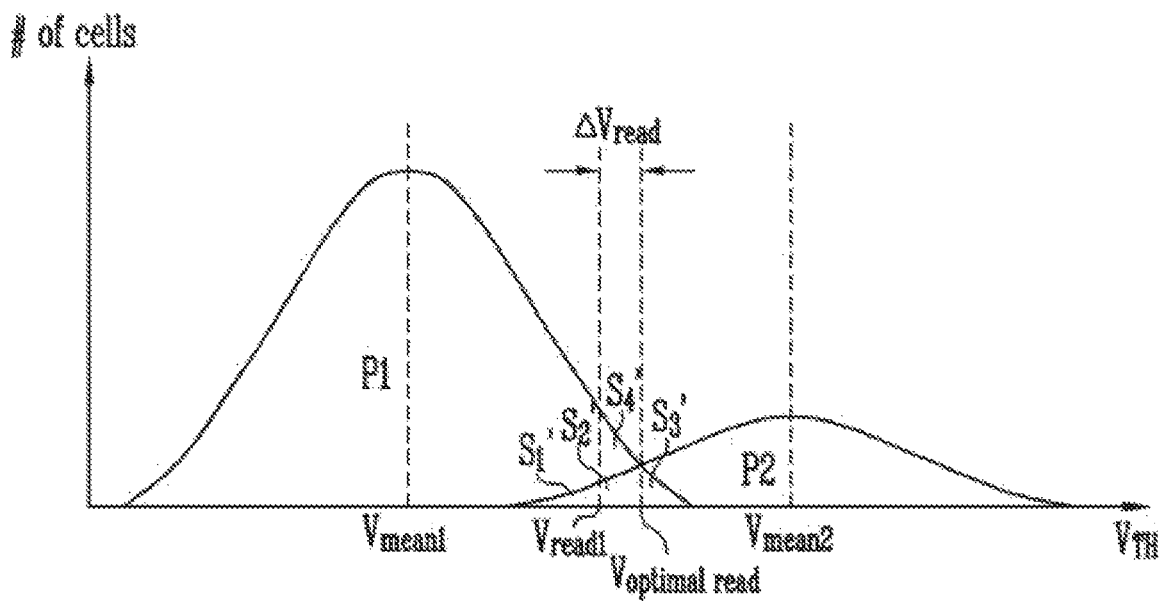
FIG. 6 is a diagram illustrating an optimal read voltage for minimizing that a read operation fails when numbers of memory cells forming threshold voltage distributions are different.

FIG. 6 is a diagram illustrating an optimal read voltage for minimizing a read operation failure when numbers of memory cells forming threshold voltage distributions are different.

FIG. 6 illustrates distributions P1 and P2 when numbers of memory cells included in threshold voltage distributions are different. When a read operation is performed using the median read voltage $V_{read1}$ described in FIG. 5, a probability $P_{rf1'}$ that the read operation will fail may be acquired by the following Equation 3.

$P_{rf1'}$=Number of cells located in areas $S1'$ to $S4'$/ (Number of cells forming distribution $P1$+Number of cells forming distribution $P2$)     [Equation 3]

An optimal read voltage for minimizing the read operation failure may be a voltage corresponding to a point at which both distributions intersect each other. For example, the sum of the median read voltage $V_{read1}$ as a voltage corresponding to an intersection point of the distributions P1 and P2 and an offset voltage $\Delta V_{read}$ may be an optimal read voltage $V_{optimal\ read}$.

The optimal read voltage may be determined by considering cell number information corresponding to each distribution.

When a read operation is performed using the optimal read voltage $V_{optimal\ read}$, a probability $P_{orf1}$ that the read operation will fail may be acquired by the following Equation 4.

$P_{orf1}$=Number of cells located in areas $S1'$ to $S3'$/ (Number of cells forming distribution $P1$+Number of cells forming distribution $P2$)     [Equation 4]

As compared with the case where the read operation is performed using the median read voltage $V_{read1}$, read fail does not occur in a memory cell located in the area S4', when a read operation is performed using the optimal read voltage $V_{optimal\ read}$. Thus, the probability that the read operation will fail can be reduced.

In an embodiment of the present disclosure, each of the distributions P1 and P2 may be a Gaussian distribution. The optimal read voltage $V_{optimal\ read}$ may be acquired by the following Equation 5:

$$V_{optimal\ read} = V_{mean1} + \frac{V_{mean2} - V_{mean1}}{2} + \frac{\sigma^2}{V_{mean2} - V_{mean1}}\left(\frac{n_1}{n_2}\right),\quad\text{[Equation 5]}$$

wherein $V_{mean1}$ is the average threshold voltage of the threshold voltage distribution P1 (i.e., a lower threshold voltage distribution), $V_{mean2}$ is the average threshold voltage of the threshold voltage distribution P2 (i.e., a higher threshold voltage distribution), $\sigma^2$ is a variance of the threshold voltage distributions P1 and P2 as the Gaussian distribution, $n_1$ is the number of memory cells included in the threshold voltage distribution P1 (i.e., the cell number information corresponding to the low threshold voltage distribution P1), and $n_2$ is the number of memory cells included in the threshold voltage distribution P2 (i.e., the cell number information corresponding to the higher threshold voltage distribution P2).

Therefore, a value obtained by adding the offset value $$\left(\frac{\sigma^2}{V_{mean2} - V_{mean1}}\left(\frac{n_1}{n_2}\right)\right)$$

determined by cell number information ($n_1$ and $n_2$) belonging to each of two adjacent distributions P1 and P2 to the average $$\left(V_{mean1} + \frac{V_{mean2} - V_{mean1}}{2}\right)$$

value of average threshold voltages $V_{mean1}$ and $V_{mean2}$ of the two distributions P1 and P2 may be determined as the optimal read voltage $V_{optimal\ read}$. The offset value may be a value obtained by multiplying a ratio $$\left(\frac{n_1}{n_2}\right)$$

of cell number information belonging to the two distributions P1 and P2 and a value $$\left(\frac{\sigma^2}{V_{mean2} - V_{mean1}}\right)$$

obtained by dividing the variance $\sigma^2$ of the Gaussian distribution by the difference between the average threshold voltages $V_{mean1}$ and $V_{mean2}$ of the two distributions P1 and P2.

According to the above equation, an average threshold voltage of each distribution and a ratio of memory cells forming each distribution are known.

Figure 7:
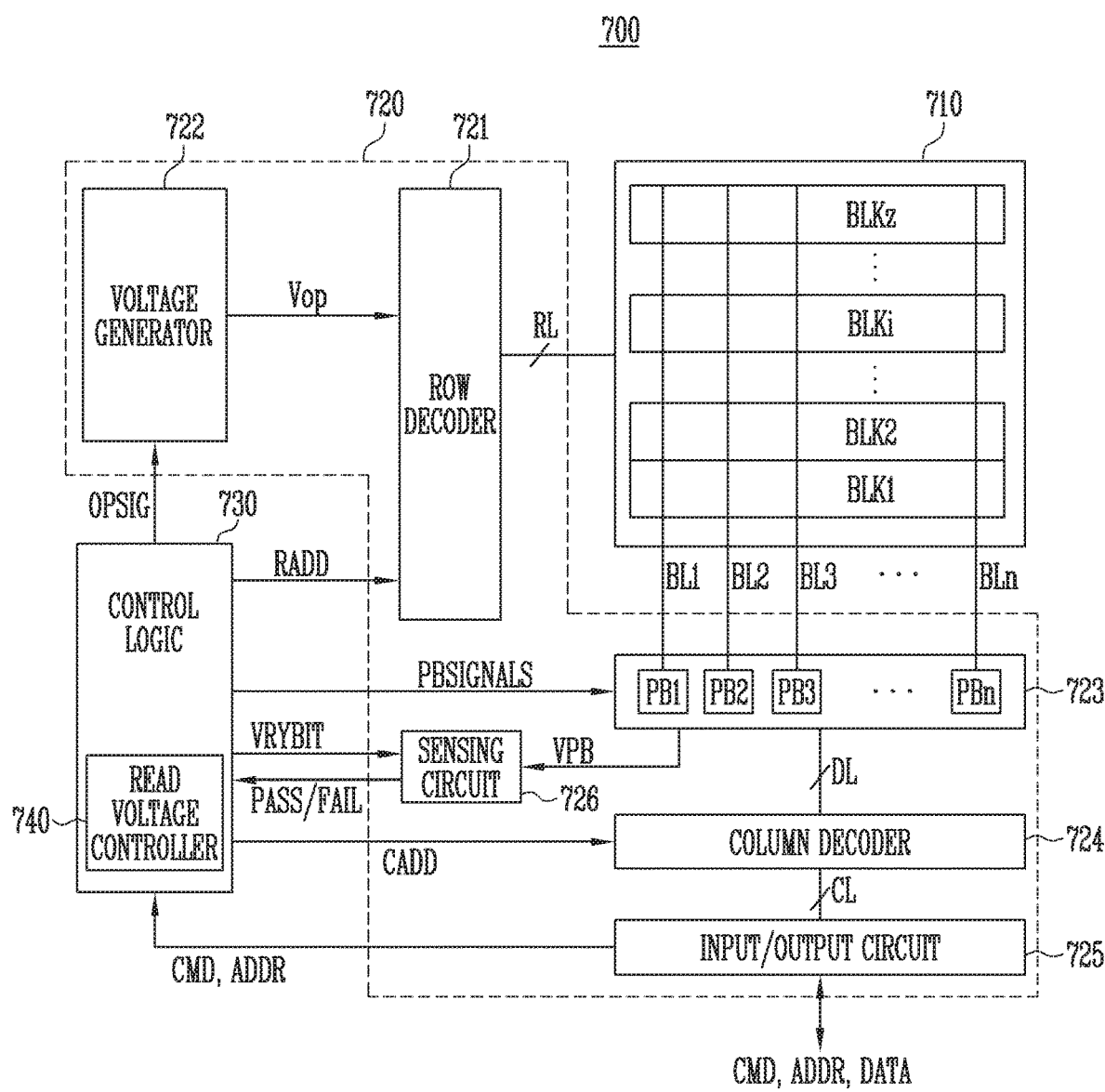
FIG. 7 is a diagram illustrating a memory device in accordance with an embodiment of the present disclosure.

FIG. 7 is a diagram illustrating a memory device in accordance with an embodiment of the present disclosure.

Referring to FIG. 7, the memory device 700 may include a memory cell array 710, a peripheral circuit 720, and a control logic 730.

The memory cell array 710 includes a plurality of memory blocks BLK1 to BLKz. The plurality of memory blocks BLK1 to BLKz are coupled to a row decoder 721. The plurality of memory blocks BLK1 to BLKz may be coupled to a page buffer group 723 through bit lines BL1 to BLn. Each of the plurality of memory blocks BLK1 to BLKz may include a plurality of memory cells. In an embodiment, the plurality of memory cells may be nonvolatile memory cells. Memory cells coupled to the same word line may be defined as one page. Therefore, one memory block may include a plurality of pages.

The row lines RL may include at least one source select line, a plurality of word lines, and at least one drain select line.

Each of the memory cells included in the memory cell array 710 may be configured as a Single Level Cell (SLC) for storing one data bit, a Multi-Level Cell (MLC) for storing two data bits, a Triple Level Cell (TLC) for storing three data bits, or a Quad Level Cell (QLC) for storing four data bits.

The peripheral circuit 720 may perform a program, read, or erase operation in a selected area of the memory cell array 710 under the control of the control logic 730. The peripheral circuit 720 may drive the memory cell array 710. For example, the peripheral circuit 720 may apply various operating voltages to the row lines RL and the bit lines BL1 to BLn or discharge the applied voltages under the control of the control logic 730.

Information on a default read voltage may be stored in the memory cell array 710.

In accordance with another embodiment of the present disclosure, numbers of memory cells included in threshold voltage distributions that the memory cells form may be set in advance by the memory controller. That is, the memory controller may store data by intentionally setting numbers of memory cells included in threshold voltage distributions to be different from each other. An optimal read voltage determined according to the method described with reference to FIG. 6 may be stored as the default read voltage in the memory cell array 710.

The peripheral circuit 720 may include the row decoder 721, a voltage generator 722, the page buffer group 723, a column decoder 724, and an input/output circuit 725.

The row decoder 721 is coupled to the memory cell array 710 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 721 operates under the control of the control logic 730. The row decoder 721 receives a row address RADD from the control logic 730.

The row decoder 721 decodes the received address ADDR. The row decoder 721 selects at least one memory block among the memory blocks BLK1 to BLKz according to the decoded address. Also, the row decoder 721 may select at least one word line of the selected memory block such that voltages generated by the voltage generator 722 are applied to the word line according to the decoded address.

For example, in a program operation, the row decoder 721 may apply a program voltage to the selected word line, and apply a program pass voltage having a level lower than that of the program voltage to unselected word lines. In a program verify operation, the row decoder 721 may apply a verify voltage to the selected word line, and apply a verify pass voltage having a level higher than that of the verify voltage to the unselected word lines. In a read operation, the row decoder 721 may apply a read voltage to the selected word line, and apply a read pass voltage having a level higher than that of the read voltage to the unselected word lines.

In an embodiment, an erase operation of the memory device 700 is performed in units of memory blocks. In an erase operation, the row decoder 721 may select one memory block according to the decoded address. In the erase operation, the row decoder 721 may apply a ground voltage to word lines coupled to the selected memory block.

The voltage generator 722 operates under the control of the control logic 730. The voltage generator 722 generates a plurality of voltages by using an external power voltage supplied to the memory device 700. Specifically, the voltage generator 722 may generate various operating voltages Vop used in program, read, and erase operations in response to an operation signal OPSIG. For example, the voltage generator 722 may generate a program voltage, a verify voltage, a pass voltage, a read voltage, an erase voltage, and the like under the control of the control logic 730.

In an embodiment, the voltage generator 722 may generate an internal power voltage by regulating the external power voltage. The internal power voltage generated by the voltage generator 722 is used as an operating voltage of the memory device 700.

In an embodiment, the voltage generator 722 may generate a plurality of voltages by using the external power voltage or the internal power voltage.

For example, the voltage generator 722 may include a plurality of pumping capacitors for receiving the internal power voltage, and generate a plurality of voltages by selectively activating the plurality of pumping capacitors under the control of the control logic 730.

The plurality of generated voltages may be supplied to the memory cell array 710 by the row decoder 721.

The page buffer group 723 includes a first to nth page buffers PB1 to PBn. The first to nth page buffers PB1 to PBn are coupled to the memory cell array 710 respectively through first to nth bit lines BL1 to BLn. The first to nth page buffers PB1 to PBn operate under the control of the control logic 730. Specifically, the first to nth page buffers PB1 to PBn may operate in response to page buffer control signals PBSIGNALS. For example, the first to nth page buffers PB1 to PBn may temporarily store data received through the first to nth bit lines BL1 to BLn, or sense voltages or currents of the bit lines BL1 to BLn in a read or verify operation.

Specifically, in a program operation, the first to nth page buffers PB1 to PBn may transfer data DATA received through the input/output circuit 725 when a program pulse is applied to a selected word line to selected memory cells through the first to nth bit lines BL1 to BLn. The selected memory cells are programmed according to the transferred data DATA. A memory cell coupled to a bit line through which a program allow voltage (e.g., a ground voltage) is applied may have an increased threshold voltage. A threshold voltage of a memory cell coupled to a bit line through which a program inhibit voltage (e.g., a power voltage) is applied may be maintained. In a program verify operation, the first to nth page buffers PB1 to PBn read page data stored from the selected memory cells through the first to nth bit lines BL1 to BLn.

In a read operation, the first to nth page buffers PB1 to PBn read data DATA from memory cells of a selected page through the first to nth bit lines BL1 to BLn, and output the read data DATA to the input/output circuit 725 under the control of the column decoder 724.

In an erase operation, the first to nth page buffers PB1 to PBn may float the first to nth bit lines BL1 to BLn.

The column decoder 724 may transfer data between the input/output circuit 725 and the page buffer group 723 in response to a column address CADD. For example, the column decoder 724 may communicate data with the first to nth page buffers PB1 to PBn through data lines DL, or communicate data with the input/output circuit 725 through column lines CL.

The input/output circuit 725 may transfer a command CMD and an address ADDR, which are received from the controller 200 described with reference to FIG. 1, to the control logic 730, or communicate data DATA with the column decoder 724.

In a read operation or verify operation, a sensing circuit 726 may generate a reference current in response to an allow bit signal VRYBIT, and output a pass signal PASS or fail signal FAIL by comparing a sensing voltage VPB received from the page buffer group 723 and a reference voltage generated by the reference current.

The control logic 730 may control the peripheral circuit 720 by outputting the operation signal OPSIG, the row address RADD, the page buffer control signals PBSIG-NALS, and the allow bit signal VRYBIT in response to the command CMD and the address ADDR. Also, the control logic 730 may determine whether the verify operation has passed or failed in response to the pass or fail signal PASS or FAIL.

The control logic 730 may include a read voltage controller 740. The read voltage controller 740 may perform a read operation on a selected word line in response to a read command input from the memory controller. When a reset operation of the memory device 700 is performed, the read voltage controller 740 may read and store a default read voltage stored in the memory cell array 710. The read voltage controller 740 may change a value corresponding to the stored default read voltage under the control of the memory controller.

In an embodiment, the read voltage controller 740 may change a read voltage into a plurality of reference read voltages under the control of the memory controller. Alternatively, the read voltage controller 740 may change the read voltage into an optimal read voltage under the control of the memory controller. A read operation may be performed using the read voltage stored in the read voltage controller 740.

Figure 8:
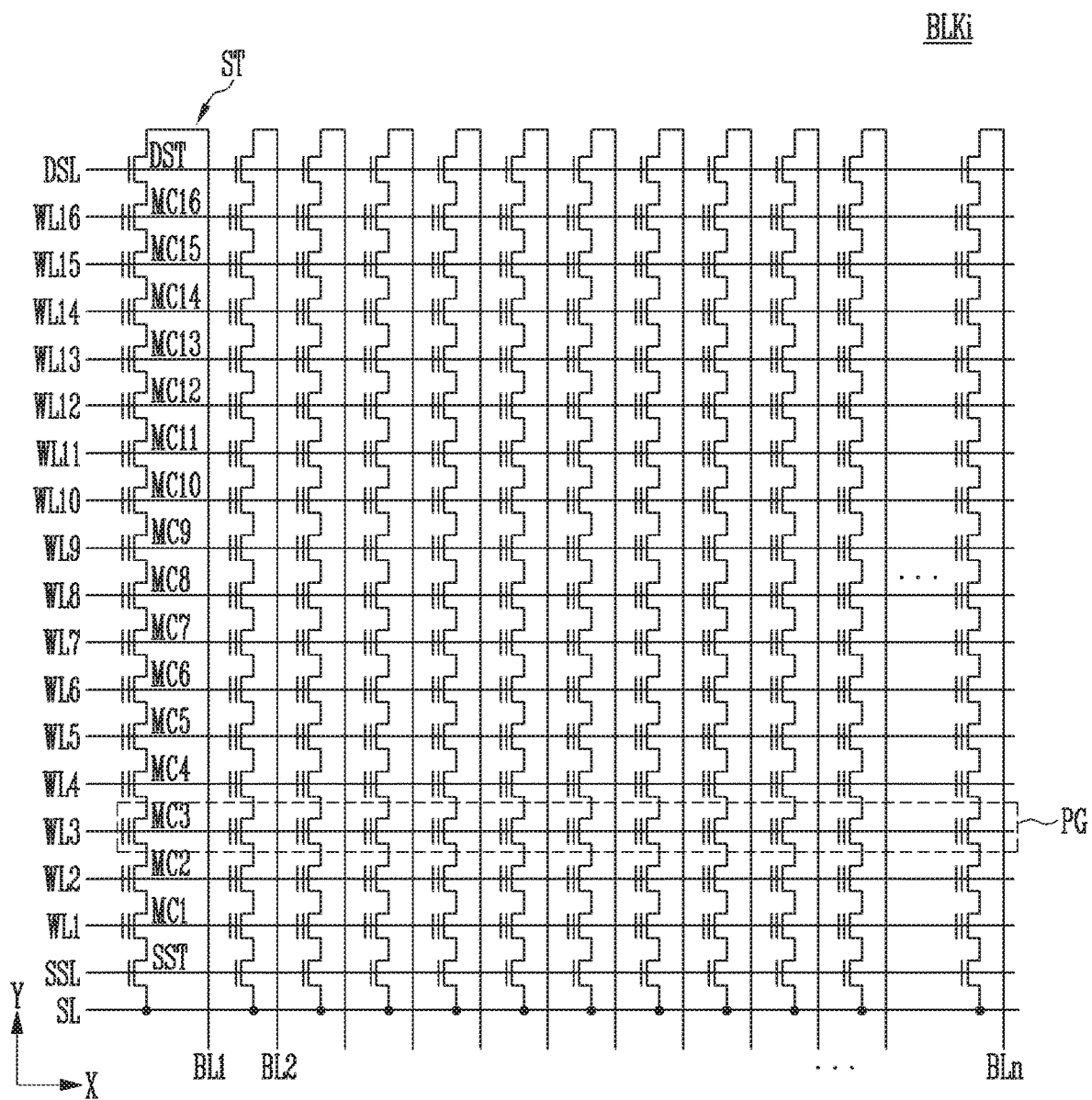
FIG. 8 is a diagram illustrating a memory block shown in FIG. 7.

FIG. 8 is a diagram illustrating a memory block BLKi shown in FIG. 7.

Referring to FIG. 8, in the memory block BLKi, a plurality of word lines may be arranged in parallel to each other between a first select line and a second select line. The first select line may be a source select line SSL, and the second select line may be a drain select line DSL. More specifically, the memory block BLKi may include a plurality of strings ST coupled between bit lines BL1 to BLn and a source line SL. The bit lines BL1 to BLn may be respectively coupled to the strings ST, and the source line SL may be commonly coupled to the strings ST. The strings ST may be configured identically to one another, and therefore, a string ST coupled to a first bit line BL1 will be described in detail as an example.

The string ST may include a source select transistor SST, a plurality of memory cells MC1 to MC16, and a drain select transistor DAT, which are coupled in series to each other between the source line SL and the first bit line BL1. At least one source select transistor SST and at least one drain select transistor DST may be included in one string ST, and memory cells of which number is greater than that of the memory cells MC1 to MC16 shown in the drawing may be included in the one string ST.

A source of the source select transistor SST may be coupled to the source line SL, and a drain of the drain select transistor DAT may be coupled to the first bit line BL1. The memory cells MC1 to MC16 may be coupled in series between the source select transistor SST and the drain select transistor DST. Gates of source select transistors SST included in different strings ST may be coupled to the source select line SSL, and gates of drain select transistors DST included in different strings ST may be coupled to the drain select line DSL. Gates of the memory cells MC1 to MC16 may be coupled to a plurality of word lines WL1 to WL16. A group of memory cells coupled to the same word line among memory cells included in different strings ST may be referred to as a physical page PG. Therefore, physical pages PG corresponding to the number of the word lines WL1 to WL16 may be included in the memory block BLKi.

One memory cell may store data of one bit. The memory cell is generally called as a single level cell (SLC). One physical page PG may store one logical page (LPG) data. The one LPG data may include data bits of which number corresponds to that of cells included in one physical page PG. In addition, one memory cell MC may store data of two or more bits. The memory cell is generally called as a multi-level cell (MLC). One physical page PG may store two or more LPG data.

Figure 9:
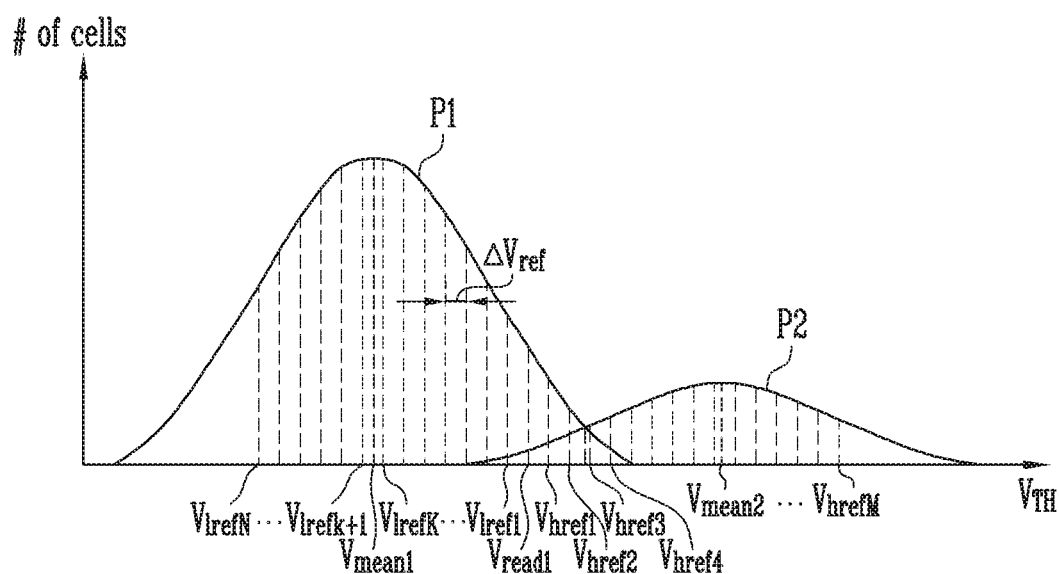

FIGS. 9 to 11 are diagrams illustrating a method for finding an average threshold voltage and cell number information.

Referring to FIG. 9, when a read operation using a default read voltage $V_{read}$ fails, the read operation controller 210 described with reference to FIG. 1 may control the memory device 300 to perform a read operation using a plurality of reference voltages $V_{lref1}$ to $V_{lrefN}$ and $V_{href1}$ to $V_{hrefM}$, which may be set or predetermined.

Data acquired through the read operation using the plurality of reference voltages $V_{lref1}$ to $V_{lrefN}$ and $V_{href1}$ to $V_{hrefM}$ may be reference data chunks $D_{l1}$ to $D_{lN}$ and $D_{h1}$ to $D_{hM}$ shown in FIGS. 10 and 11.

The plurality of reference voltages $V_{lref1}$ to $V_{lrefN}$ and $V_{href1}$ to $V_{hrefM}$ may include first reference voltages $V_{lref1}$ to $V_{lrefN}$ and second reference voltages $V_{href1}$ to $V_{hrefM}$. The first reference voltages $V_{lref1}$ to $V_{lrefN}$ are voltages for reading reference data included in memory cells forming the lower threshold voltage distribution P1, and the second reference voltages $V_{href1}$ to $V_{hrefM}$ are voltages for reading reference data included in memory cells forming the higher threshold voltage distribution P2.

Although a case where a voltage difference $\Delta V_{ref}$ between the plurality of reference voltages $V_{lref1}$ to $V_{lrefN}$ and $V_{href1}$ to $V_{hrefM}$ is constant is illustrated in FIG. 9, the voltage difference between the plurality of reference voltages Wei to $V_{lrefN}$ and $V_{href1}$ to $V_{hrefM}$ may be irregular. The read operation controller 210 may control the memory device 300 such that the plurality of reference voltages $V_{lref1}$ to $V_{lrefN}$ and $V_{href1}$ to $V_{hrefM}$ are applied to a selected word line regardless of an order thereof. A number N of the first reference voltages and a number M of the second reference voltages may be values determined in advance.

Memory cells having threshold voltages lower than the plurality of reference voltages Wei to $V_{lrefN}$ and $V_{href1}$ to $V_{hrefM}$ applied to a word line to which selected memory cells are coupled may be read as on-cells (data "1"). Memory cells having threshold voltages higher than the plurality of reference voltages Wei to $V_{lrefN}$ and $V_{href1}$ to $V_{hrefM}$ are coupled may be read as off-cells (data "0").

A method for finding the average threshold voltage and cell number information of the lower threshold voltage distribution P1 will be described with reference to FIGS. 9 and 10. The number of on-cells ("1") that reference data represents may be decreased as the reference voltage applied to a selected word line is decreased. Referring to FIG. 10, numbers of on-cells ("1") included in reference data chunks $D_{l1}$, $D_{l2}$, $D_{l3}$, $D_{lK}$, and $D_{lK+1}$ read using reference voltages $V_{lref1}$, $V_{lref2}$, $V_{lref3}$, $V_{lrefK}$, and $V_{lrefK+1}$ may be respectively 2145, 2135, 2123, 1178, and 1145, which are gradually decreased.

When a plurality of reference voltages are used, a number of memory cells included in intervals defined by adjacent reference voltages may be calculated. For example, an area of the distribution, which is defined by $V_{lref1}$ and $V_{lref2}$, may be defined as an interval L1, an area of the distribution, which is defined by $V_{lref2}$ and $V_{lref3}$, may be defined as an interval L2, and an area of the distribution, which is defined by $V_{lref3}$ and $V_{lref4}$, may be defined as an interval L3.

In an embodiment of the present disclosure, a number of memory cells included in each interval may be determined by a difference in number of on-cells ("1") between reference data chunks. For example, reference data chunks corresponding to the reference voltages $V_{lref1}$ and $V_{lref2}$ defining the interval L1 are $D_{l1}$ and $D_{l2}$, respectively, and the difference between numbers of on-cells, which $D_{l1}$ and $D_{l2}$ represent is 10. Therefore, the number of memory cells included in the interval L1 may be determined as 10. In this manner, the number of memory cells included in the interval L2 may be determined as 12.

In another embodiment of the present disclosure, a number of memory cells included in a reference voltage interval may be determined using the fact that the number of off-cells ("0") included in a reference data chunk is increased as a reference voltage is decreased.

The average threshold voltage may be acquired based on an interval in which the largest number of memory cells is included. As shown in FIG. 10, while the number of memory cells included in each interval is gradually increased from the interval L1 to an interval LK, the number of memory cells included in each interval is gradually decreased from the interval LK to an interval LN−1. Therefore, the number of memory cells included in the interval LK may be greatest. The average threshold voltage $V_{mean1}$ of the lower threshold voltage distribution P1 may be acquired based on the reference voltages $V_{lrefK}$ and $V_{lrefK+1}$ defining the interval LK. In an embodiment of the present disclosure, $V_{mean1}$ may be determined as a median value of the reference voltages $V_{lrefK}$ and $V_{lrefK+1}$. In various embodiments, $V_{mean1}$ may be determined as any one value between the reference voltages $V_{lrefK}$ and $V_{lrefK+1}$.

The cell number information may be acquired based on a reference interval including the largest number of memory cells. For example, 33 which is the number of memory cells included in the interval LK may become the cell number information of the lower threshold voltage distribution P1.

A method for finding an average threshold voltage and cell number information of the higher threshold voltage distribution P2 will be described with reference to FIGS. 9 and 11. The number of on-cells ("1") included in a reference data chunk may be increased as a reference voltage applied to a selected word line is increased. For example, numbers of on-cells ("1") included in reference data chunks $D_{h1}$, $D_{h2}$, $D_{h3}$, $D_{h4}$ $D_{hK}$, and $D_{hK+1}$ read using reference voltages $V_{href1}$, $V_{href2}$, $V_{href3}$, $V_{href4}$, $V_{hrefK}$, and $V_{hrefK+1}$ may be respectively 2153, 2157, 2160, 2165, 2333 and 2352, which are gradually increased.

Areas of the distribution, which a plurality of reference voltages define, may be defined as a plurality of intervals. For example, an area of the distribution, which is defined by $V_{href1}$ and $V_{href2}$, may be defined as an interval h1, an area of the distribution, which is defined by $V_{href2}$ and $V_{href3}$, may be defined as an interval h2, and an area of the distribution, which is defined by $V_{href3}$ and $V_{href4}$, may be defined as an interval h3.

In an embodiment of the present disclosure, a number of memory cells included in an interval may be determined by a difference in number of on-cells ("1") between reference data. For example, reference data corresponding to the reference voltages $V_{href1}$ and $V_{href2}$ defining the interval h1 are $D_{h1}$ and $D_{h2}$, respectively, and the difference between numbers of on-cells, which $D_{h1}$ and $D_{h2}$ represent is 4. Therefore, the number of memory cells included in the interval h1 may be determined as 4. In this manner, the number of memory cells included in the interval h2 may be determined as 3.

In another embodiment of the present disclosure, a number of memory cells included in an interval may be determined using the fact that the number of off-cells ("0") that reference data represents is increased as a reference voltage is increased.

The average threshold voltage may be acquired based on an interval in which the largest number of memory cells is included. As shown in FIG. 11, the number of memory cells included in the interval hK may be greatest. The average threshold voltage $V_{mean2}$ of the higher threshold voltage distribution P2 may be acquired based on the reference voltages $V_{hrefK}$ and $V_{hrefK+1}$ defining the interval hK. In an embodiment of the present disclosure, $V_{mean2}$ may be determined as a median value of the reference voltages $V_{hrefK}$ and $V_{hrefK+1}$. In an embodiment of the present disclosure, $V_{mean2}$ may be determined as any one value between the reference voltages $V_{hrefK}$ and $V_{hrefK+1}$.

The cell number information may be acquired based on a reference interval including the largest number of memory cells. For example, 19 as the number of memory cells included in the interval hK may become the cell number information of the higher threshold voltage distribution P2.

Although it is described that the average threshold voltage and the cell number information of the lower threshold voltage distribution P1 are acquired using the method in which reference voltages that are gradually decreased are applied to a selected word line, and the average threshold voltage and the cell number information of the higher threshold voltage distribution P2 are acquired using the method in which reference voltages that are gradually increased are applied to a selected word line, average threshold voltages and cell number information may be acquired by exchanging the methods. In addition, an average threshold voltage and cell number information may be acquired by applying arbitrary reference voltages.

Figure 12:
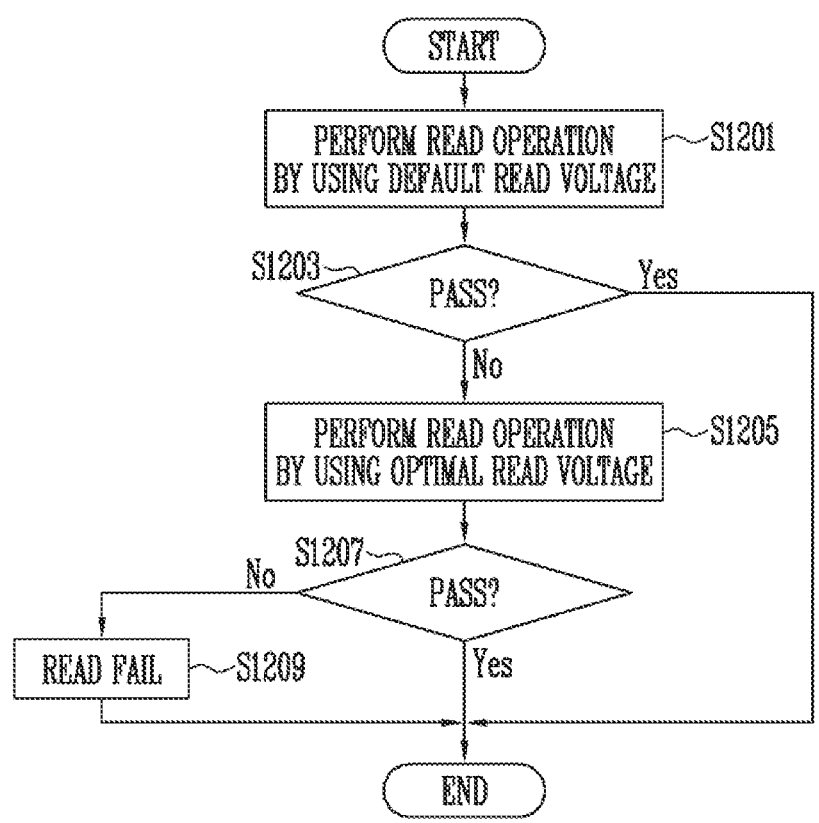
FIG. 12 is a flowchart illustrating an operating method of the storage device in accordance with an embodiment of the present disclosure.

FIG. 12 is a flowchart illustrating an operating method of the storage device in accordance with an embodiment of the present disclosure.

Referring to FIG. 12, in step S1201, the storage device may perform a read operation by using a default read voltage.

In step S1203, the storage device may determine whether the read operation using the default read voltage has passed. When the read operation passes (that is, "Yes" at step S1203), the read operation is ended. When the read operation does not pass (that is, "No" at step S1203), the storage device proceeds to step S1205.

In the step S1205, the storage device may perform a read operation by using an optimal read voltage.

In step S1207, the storage device may determine whether the read operation using the optimal read voltage has passed. When the read operation does not pass as the determination result (that is, "No" at step S1207), the storage device determines that the read operation has failed and proceeds to step S1209. When the read operation passes (that is, "Yes" at step S1207), the read operation is ended.

Figure 13:
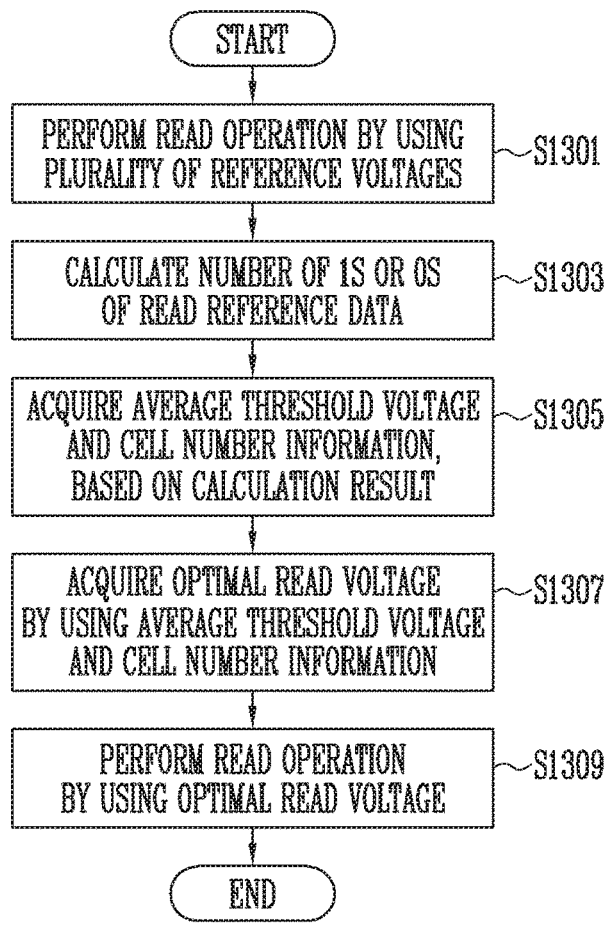
FIG. 13 is a flowchart illustrating an operating method of the memory controller in accordance with an embodiment of the present disclosure.

FIG. 13 is a flowchart illustrating an operating method of the memory controller in accordance with an embodiment of the present disclosure.

Referring to FIG. 13, in step S1301, the memory controller may control the memory device to perform a read operation, using a plurality of reference voltages. The memory controller may acquire, from the memory device, reference data as a result obtained by performing the read operation using the plurality of reference voltages.

In step S1303, the memory controller may count a number of 1s or 0s identified by the reference data corresponding to each of the plurality of reference voltages. The memory controller may calculate a number of 1s or 0s included in each of a plurality of intervals formed by the plurality of reference voltages.

In step S1305, the memory controller may acquire an average threshold voltage of each adjacent threshold voltage distribution and cell number information of memory cells included in the corresponding distribution. Specifically, the average threshold voltage of the threshold voltage distribution may be acquired by calculating a median value of an interval including the largest number of memory cells.

In step S1307, the memory controller may acquire an optimal read voltage by using the average threshold voltage and the cell number information. Specifically, the memory controller may determine, as the optimal read voltage, a value obtained by adding an offset value determined by cell number information belonging to each of two adjacent distributions to an average value of the average threshold voltages of the two distributions. The offset value may be a value obtained by multiplying a ratio of cell number information belonging to the two distributions and a value obtained by dividing the variance of the Gaussian distribution by a the difference between the average threshold voltages of the two distributions.

In step S1309, the memory controller may control the memory device to perform a read operation by using the optimal read voltage determined in the step S1307.

Figure 14:
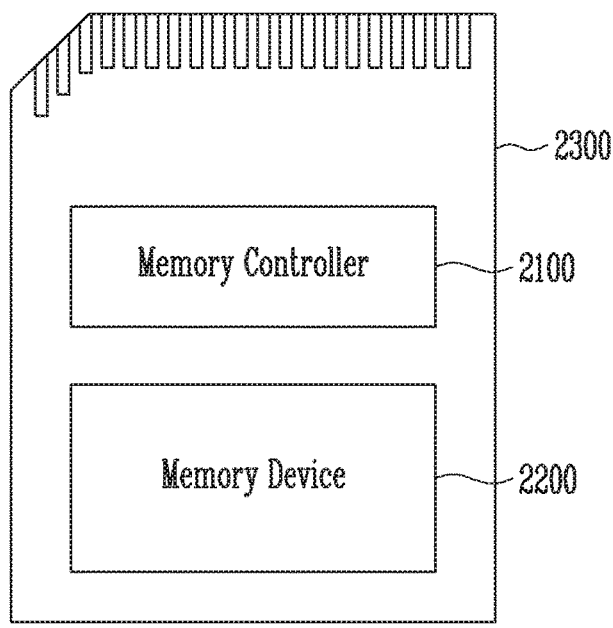
FIG. 14 is a block diagram illustrating a memory card system to which the storage device is applied in accordance with an embodiment of the present disclosure.

FIG. 14 is a block diagram illustrating a memory card system to which the storage device is applied in accordance with an embodiment of the present disclosure.

Referring to FIG. 14, the memory card system 2000 includes a memory controller 2100, a memory device, and a connector 2300.

The memory controller 2100 is coupled to the memory device 2200. The memory controller 2100 is configured to access the memory device 2200. For example, the memory controller 2100 is configured to control read, write, erase, and background operations of the memory device 2200. The memory controller 2100 is configured to provide an interface between the memory device 2200 and a host. The memory controller 2100 is configured to drive firmware for controlling the memory device 2200. The memory controller 2100 may be implemented identically to the memory controller 200 described with reference to FIG. 1.

In an example, the memory controller 2100 may include components such as a Random Access Memory (RAM), a processing unit, a host interface, a memory interface, and an ECC circuit.

The memory controller 2100 may communicate with an external device through the connector 2300. The memory controller 2100 may communicate with the external device (e.g., the host) according to a specific communication protocol. In an example, the memory controller 2100 may communicate with the external device through at least one of various communication protocols such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and NVMe.

In an example, the memory device 2200 may be implemented with various nonvolatile memory devices such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), and a Spin Transfer Torque magnetic RAM (STT-MRAM).

Operations of the read operation controller 210 and the optimal read voltage operating component 220 may be performed by the memory controller 2100.

In an example, the memory controller 2100 or the memory device 2200 may be packaged in a manner such as Package On Package (PoP), Ball Grid Arrays (BGAs), Chip Scale Packages (CSPs), Plastic Leaded Chip Carrier (PLCC), Plastic Dual In-line Package (PDIP), die in Waffle pack, die in wafer form, Chip On Board (COB), CERamic Dual In-line Package (CERDIP), plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi-Chip Package (MCP), Wafer-level Fabricated Package (WFP), or Wafer-level processed Stack Package (WSP), to be provided as a single semiconductor package. Alternatively, the memory device 2200 may include a plurality of nonvolatile memory chips, and the plurality of nonvolatile memory chips may be packaged based on the above-described packaging manners, to be provided as a single semiconductor package.

In an example, the memory controller 2100 and the memory device 2200 may be integrated as a single semiconductor device. In an example, the memory controller 2100 and the memory device 2200 may be integrated as a single semiconductor device, to constitute a Solid State Drive (SSD). The memory controller 2100 and the memory device 2200 may be integrated as a single semiconductor device, to constitute a memory card. For example, the memory controller 2100 and the memory device 2200 may be integrated as a single semiconductor device, to constitute a memory card such as a PC card (Personal Computer Memory Card International Association (PCMCIA)), a Compact Flash (CF) card, a Smart Media Card (SM and SMC), a memory stick, a Multi-Media Card (MMC, RS-MMC, MMCmicro and eMMC), an SD card (SD, miniSD, microSD and SDHC), and a Universal Flash Storage (UFS).

In an example, the memory device 2200 may be the memory device 300 described with reference to FIG. 1.

Figure 15:
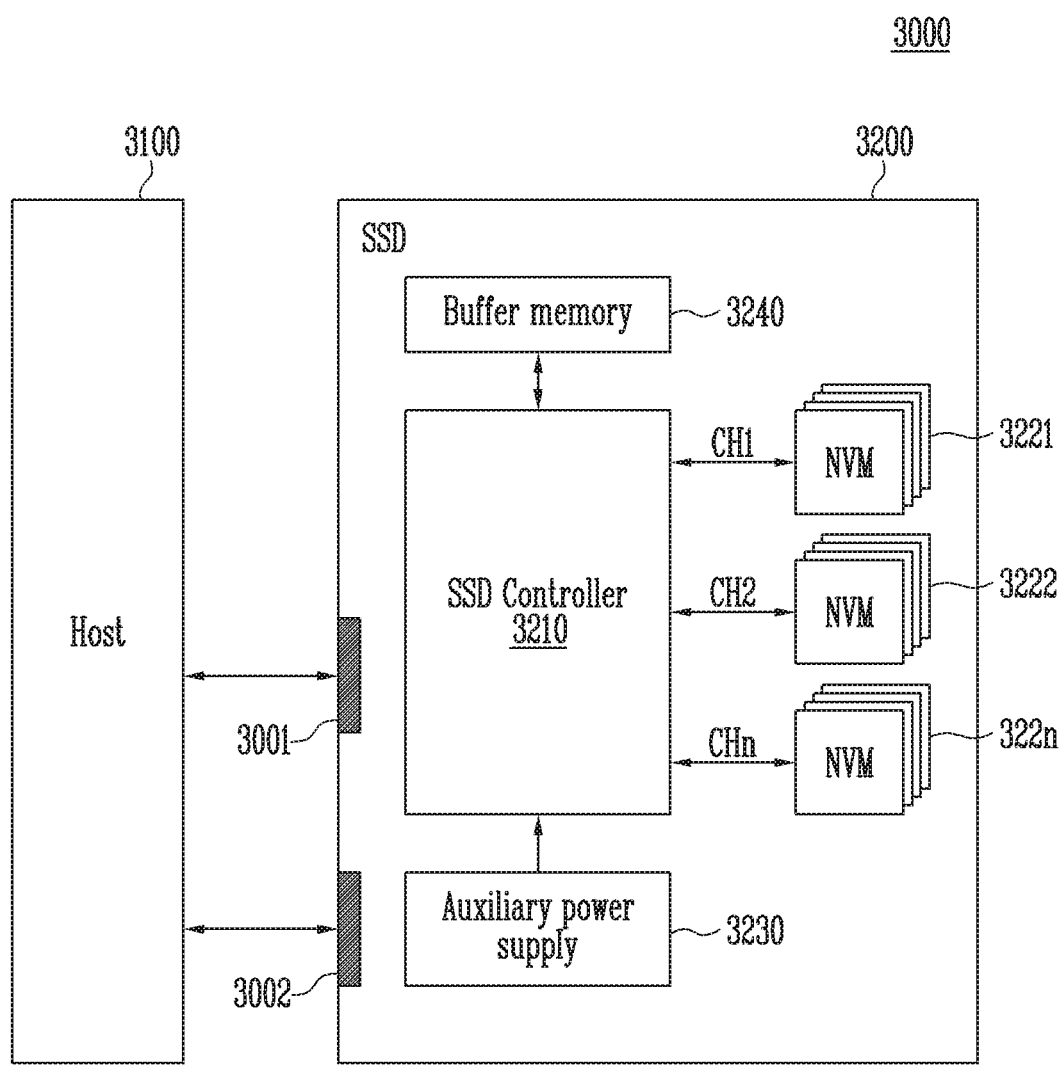
FIG. 15 is a block diagram exemplarily illustrating a Solid State Drive (SSD) system to which the storage device is applied in accordance with an embodiment of the present disclosure.

FIG. 15 is a block diagram exemplarily illustrating a Solid State Drive (SSD) system to which the storage device is applied in accordance with an embodiment of the present disclosure.

Referring to FIG. 15, the SSD system 3000 includes a host 3100 and an SSD 3200. The SSD 3200 exchanges a signal SIG with the host 3100 through a signal connector 3001, and receives power PWR through a power connector 3002. The SSD 3200 includes an SSD controller 3210, a plurality of flash memories 3221 to 322n, an auxiliary power supply 3230, and a buffer memory 3240.

In an embodiment, the SSD controller 3210 may serve as the memory controller 200 described with reference to FIG. 1.

The SSD controller 3210 may control the plurality of flash memories 3221 to 322n in response to a signal SIG received from the host 3100. In an example, the signal SIG may be a signal based on an interface between the host 3100 and the SSD 3200. For example, the signal SIG may be a signal defined by at least one of interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

The auxiliary power supply 3230 is coupled to the host 3100 through the power connector 3002. When the supply of power from the host 3100 is irregular, the auxiliary power supply 3230 may provide power of the SSD 3200. In an example, the auxiliary power supply 3230 may be located in the SSD 3200, or be located at the outside of the SSD 3200. For example, the auxiliary power supply 3230 may be located on a main board, and provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or temporarily store meta data (e.g., a mapping table) of the flash memories 3221 to 322n. The buffer memory 3240 may include volatile memories such as a DRAM, an SDRAM, a DDR SDRAM, an LPDDR SDRAM, and a GRAM or nonvolatile memories such as a FRAM, a ReRAM, an STT-MRAM, and a PRAM.

In an example, the nonvolatile memories 3221 to 322n may correspond to the memory device 300 described with reference to FIG. 1.

Figure 16:
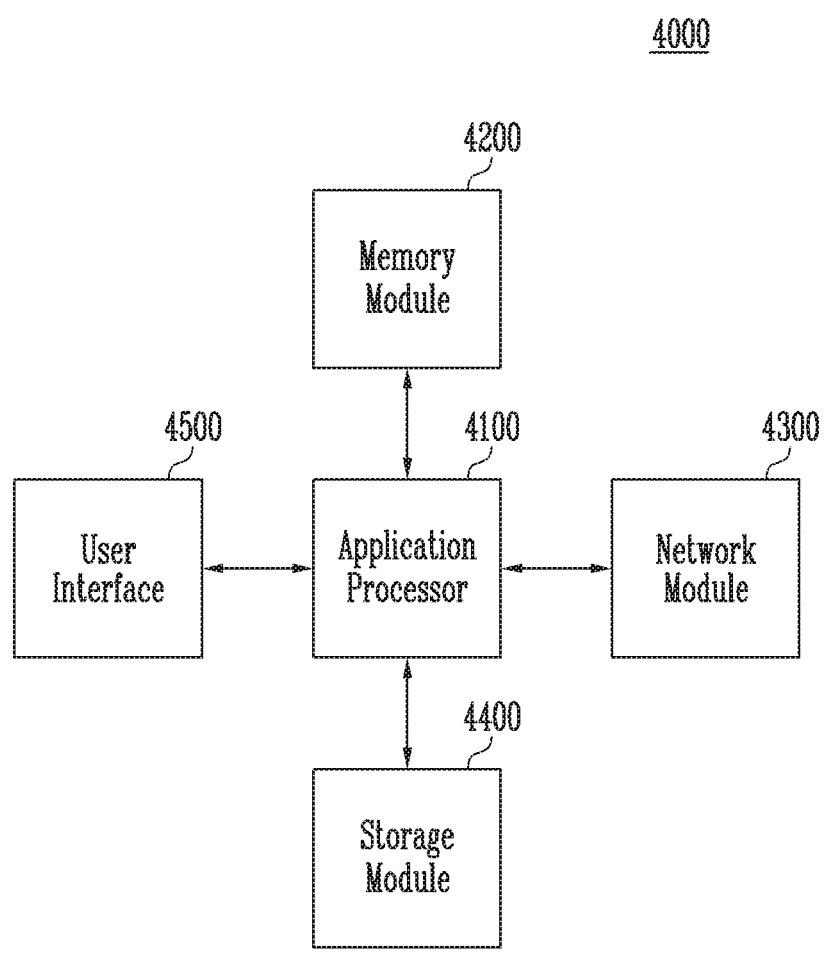
FIG. 16 is a block diagram illustrating a user system to which the storage device is applied in accordance with an embodiment of the present disclosure.

FIG. 16 is a block diagram illustrating a user system to which the storage device is applied in accordance with an embodiment of the present disclosure.

Referring to FIG. 16, the user system 4000 includes an application processor 4100, a memory module 4200, a network module 4300, a storage module 4400, and a user interface 4500.

The application processor 4100 may drive components included in the user system 4000, an operating system (OS), a user program, or the like. In an example, the application processor 4100 may include controllers for controlling components included in the user system 4000, interfaces, a graphic engine, and the like. The application processor 4100 may be provided as a System-on-Chip (SoC).

The memory module 4200 may operate as a main memory, working memory, buffer memory or cache memory of the user system 4000. The memory module 4200 may include volatile random access memories such as a DRAM, an SDRAM, a DDR SDRAM, a DDR2 SDRM, a DDR3 SDRAM, an LPDDR SDRAM, an LPDDR2 SDRAM, and an LPDDR3 SDRAM or nonvolatile random access memories such as a PRAM, a ReRAM, an MRAM, and a FRAM. In an example, the application processor 4100 and the memory module 4200 may be provided as one semiconductor package by being packaged based on a Package on Package (PoP).

The network module 4300 may communicate with external devices. In an example, the network module 4300 may support wireless communications such as Code Division Multiple Access (CDMA), Global System for Mobile communication (GSM), Wideband CDMA (WCDMA), CDMA-2000, Time Division Multiple Access (TDMA), Long Term Evolution (LTE), Wimax, WLAN, UWB, Bluetooth, and Wi-Fi. In an example, the network module 4300 may be included in the application processor 4100.

The storage module 4400 may store data. For example, the storage module 4400 may store data received from the application processor 4100. Alternatively, the storage module 4400 may transmit data stored therein to the application processor 4100. In an example, the storage module 4400 may be implemented with a nonvolatile semiconductor memory device such as a Phase-change RAM (PRAM), a Magnetic RAM (MRAM), a Resistive RAM (RRAM), a NAND flash, a NOR flash, or a NAND flash having a three-dimensional structure. In an example, the storage module 4400 may be provided as a removable drive such as a memory card of the user system 4000 or an external drive.

In an example, the storage module 4400 may include a plurality of nonvolatile memory devices, and the plurality of nonvolatile memory devices may correspond to the memory device 300 described with reference to FIG. 1.

The user interface 4500 may include interfaces for inputting data or commands to the application processor 4100 or outputting data to an external device. In an example, the user interface 4500 may include user input interfaces such as a keyboard, a keypad, a button, a touch panel, a touch screen, a touch pad, a touch ball, a camera, a microphone, a gyroscope sensor, a vibration sensor and a piezoelectric element. The user interface 4500 may include user output interfaces such as a Liquid Crystal Display (LCD), an Organic Light Emitting Diode (OLED) display device, an Active Matrix OLED (AMOLED) display device, an LED, a speaker, and a monitor.

In the storage device and the operating method thereof in accordance with the present disclosure, an improved data recovery rate can be provided.

While the present disclosure has been shown and described with reference to certain exemplary embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described exemplary embodiments but should be determined by not only the appended claims but also the equivalents thereof.

In the above-described embodiments, all steps may be selectively performed or parts of the steps may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the exemplary embodiments of the present disclosure have been described in the drawings and specification. Although specific terminologies are used here, those are only to describe the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

The above described embodiments of the present invention are intended to illustrate and not to limit the present invention. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A memory controller for controlling a memory device including a plurality of memory cells, the memory controller comprising:
    a read operation controller configured to control the memory device to perform a read operation by applying a default read voltage or optimal read voltage to a selected word line coupled to selected memory cells among the plurality of memory cells; and
    an optimal read voltage operating component configured to determine the optimal read voltage when the read operation using the default read voltage fails, based on an average threshold voltage and cell number information which is information on a memory cell number for each of first and second distributions which are adjacent threshold voltage distributions among threshold voltage distributions that the threshold voltages of the selected memory cells form,
    wherein the optimal read voltage operating component determines as the optimal read voltage, a value obtained by adding an offset value determined based on a ratio of the cell number information of each of the first and second distributions to a median value of the average threshold voltages of the first and second distributions.

2. The memory controller of claim 1, wherein, when the read operation using the default read voltage fails, the read operation controller acquires, from the memory device, a plurality of reference data chunks obtained from performing a read operation by applying a plurality of reference voltages to the selected word line, and provides the plurality of reference data chunks to the optimal read voltage operating component.

3. The memory controller of claim 2, wherein the optimal read voltage operating component includes:
    an average threshold voltage detector configured to acquire numbers of memory cells belonging to a plurality of reference voltage intervals that the plurality of reference voltages form, based on numbers of on-cells identified by the plurality of reference data chunks, and calculate the average threshold voltage of each of the first and second distributions by using the numbers of memory cells belonging to the plurality of reference voltage intervals;
    a cell counter configured to acquire the cell number information of each of the first and second distributions from the numbers of memory cells belonging to the plurality of reference voltage intervals; and
    a read voltage operating component configured to determine an optimal read voltage, based on the average threshold voltages and the cell number information.

4. The memory controller of claim 3, wherein the average threshold voltage detector selects a reference voltage interval in which the largest number of memory cells is included among the numbers of memory cells belonging to the plurality of reference voltage intervals, and determines, as the average threshold voltage, any one voltage within the selected reference voltage interval.

5. The memory controller of claim 4, wherein the average threshold voltage detector determines, as the average threshold voltage, a median value of the selected reference voltage interval.

6. The memory controller of claim 4, wherein the cell counter determines, as the cell number information, a memory cell number belonging to the selected reference voltage interval.

7. The memory controller of claim 3, wherein the read voltage operating component determines an optimal read voltage according to the following equation:

$$V_{optimal\,read} = V_{mean1} + \frac{V_{mean2} - V_{mean1}}{2} + \frac{\sigma^2}{V_{mean2} - V_{mean1}} \left(\frac{n_1}{n_2}\right),$$

wherein $V_{optimal}$ read is the optimal read voltage, $V_{mean1}$ is the average threshold voltage of a low threshold voltage distribution among adjacent threshold voltage distributions, $V_{mean2}$ is the average threshold voltage of a high threshold voltage distribution among the adjacent threshold voltage distributions, $\sigma^2$ is a variance of the adjacent threshold voltage distributions, $n_1$ is the cell number information corresponding to the low threshold voltage distribution, and $n_2$ is the cell number information corresponding to the high threshold voltage distribution.

8. A method for operating a memory controller for controlling a memory device, the method comprising:
    acquiring reference data chunks by reading selected memory cells included in the memory device, using a plurality of reference voltages;
    calculating numbers of memory cells belonging to a plurality of reference voltage intervals that the plurality of reference voltages form, based on numbers of on-cells identified by the reference data chunks;
    calculating an average threshold voltage for each of adjacent threshold voltage distributions that the selected memory cells form and cell number information which is information on memory cell numbers included in the threshold voltage distributions, based on the numbers of memory cells included in the plurality of reference voltage intervals; and
    acquiring an optimal read voltage, based on the average threshold voltage and the cell number information, wherein, in the acquiring of the optimal read voltage, the optimal read voltage is acquired by adding, to a median value of the average threshold voltages of the adjacent threshold voltage distributions, an offset determined based on a ratio of the cell number information.

9. The method of claim 8, wherein, in the calculating of the average threshold voltage and the cell number information, any one voltage value within a selected reference voltage interval in which the largest number of memory cells is included among the number of memory cells belonging to the plurality of reference voltage intervals is determined as the average threshold voltage.

10. The method of claim 9, wherein a median value of the selected reference voltage interval is determined as the average threshold voltage.

11. The method of claim 9, wherein, in the calculating of the average threshold voltage and the cell number information, a memory cell number belonging to the selected reference voltage interval is determined as the cell number information.

12. The method of claim 8, wherein, in the acquiring of the optimal read voltage, an optimal read voltage is determined according to the following equation:

$$V_{optimal\,read} = V_{mean1} + \frac{V_{mean2} - V_{mean1}}{2} + \frac{\sigma^2}{V_{mean2} - V_{mean1}}\left(\frac{n_1}{n_2}\right),$$

wherein $V_{optimal}$ read is the optimal read voltage, $V_{mean1}$ is the average threshold voltage of a low threshold voltage distribution among adjacent threshold voltage distributions, $V_{mean2}$ is the average threshold voltage of a high threshold voltage distribution among the adjacent threshold voltage distributions, $\sigma^2$ is a variance of the adjacent threshold voltage distributions, $n_1$ is the cell number information corresponding to the low threshold voltage distribution, and $n_2$ is the cell number information corresponding to the high threshold voltage distribution.

13. A memory device comprising:
a memory cell array including a plurality of memory cells;
a peripheral circuit configured to perform a read operation of reading data stored in selected memory cells among the plurality of memory cells; and
a control logic configured to control the peripheral circuit to apply an optimal read voltage to a selected word line coupled to the selected memory cells in the read operation,
wherein the optimal read voltage is calculated based on average threshold voltages and cell number information of adjacent threshold voltage distributions among threshold voltage distributions corresponding to the selected memory cells,
wherein the optimal read voltage is calculated by adding, to a median value of the average threshold voltages, an offset determined based on a ratio of the cell number information.

14. The memory device of claim 13, wherein the optimal read voltage is calculated according to the following equation:

$$V_{optimal\,read} = V_{mean1} + \frac{V_{mean2} - V_{mean1}}{2} + \frac{\sigma^2}{V_{mean2} - V_{mean1}}\left(\frac{n_1}{n_2}\right),$$

wherein $V optimal$ read is the optimal read voltage, $V_{mean1}$ is the average threshold voltage of a low threshold voltage distribution among adjacent threshold voltage distributions, $V_{mean2}$ is the average threshold voltage of a high threshold voltage distribution among the adjacent threshold voltage distributions, $\sigma^2$ is a variance of the adjacent threshold voltage distributions, $n_1$ is the cell number information corresponding to the low threshold voltage distribution, and $n_2$ is the cell number information corresponding to the high threshold voltage distribution.

* * * * *